United States Patent [19]
McConnell et al.

[11] Patent Number: 4,911,761
[45] Date of Patent: Mar. 27, 1990

[54] PROCESS AND APPARATUS FOR DRYING SURFACES

[75] Inventors: Christopher F. McConnell, West Chester; Alan E. Walter, Exton, both of Pa.

[73] Assignee: CFM Technologies Research Associates, Lionville, Pa.

[21] Appl. No.: 184,544

[22] Filed: Apr. 20, 1988

Related U.S. Application Data

[63] Continuation-in-part of Ser. No. 765,294, Aug. 13, 1985, Pat. No. 4,778,532, which is a continuation-in-part of Ser. No. 747,894, Jun. 24, 1985, Pat. No. 4,633,893, which is a continuation-in-part of Ser. No. 612,355, May 21, 1984, Pat. No. 4,577,650.

[51] Int. Cl.[4] .................................................. B08B 3/08
[52] U.S. Cl. ........................................ 134/11; 134/10; 134/30; 134/31
[58] Field of Search ................. 134/10, 11, 30, 31

[56] References Cited

U.S. PATENT DOCUMENTS

| | | | |
|---|---|---|---|
| 61,571 | 1/1867 | Searle | 417/122 |
| 539,074 | 5/1895 | Morrow | 417/122 |
| 539,075 | 5/1895 | Morrow | 417/122 |
| 728,148 | 5/1903 | Wever | 417/118 |
| 1,066,993 | 7/1913 | Carey | 417/118 |
| 1,318,160 | 8/1919 | Bianchini | 417/122 |
| 1,845,139 | 6/1929 | Exley | 417/122 |
| 2,180,274 | 6/1938 | Bentley | 417/125 |
| 3,005,417 | 10/1961 | Swaney | 103/238 |
| 3,208,157 | 9/1965 | Stark | 34/74 |
| 3,437,543 | 4/1969 | Winings | 156/345 |
| 3,607,549 | 9/1971 | Bielefeld et al. | 156/345 |
| 3,632,462 | 4/1972 | Barrington | 156/345 |
| 3,813,311 | 5/1974 | Beck et al. | 156/662 |
| 3,871,914 | 3/1975 | Goffredo et al. | 134/109 |
| 3,957,531 | 5/1976 | Tipping et al. | 134/11 |
| 3,964,957 | 6/1976 | Walsh et al. | 156/345 |
| 3,977,926 | 8/1976 | Johnson, Jr. et al. | 156/17 |
| 4,017,343 | 4/1977 | Haas et al. | 156/642 |
| 4,056,428 | 11/1977 | Harada et al. | 156/642 |
| 4,079,522 | 3/1978 | Ham | 34/1 |
| 4,105,468 | 8/1978 | Geshner et al. | 417/54 |
| 4,159,917 | 7/1979 | Gluck | 156/645 |
| 4,169,807 | 10/1979 | Zuber | 252/171 |
| 4,323,452 | 4/1982 | Witzenbury | 210/188 |
| 4,408,960 | 10/1983 | Allen | 417/59 |
| 4,426,246 | 1/1984 | Kravitz et al. | 156/643 |
| 4,479,849 | 10/1984 | Frantzen | 156/640 |
| 4,519,846 | 5/1985 | Aigo | 134/15 |
| 4,589,926 | 5/1986 | Holmstrand | 134/6 |
| 4,633,893 | 1/1987 | McConnell et al. | 134/95 |
| 4,778,532 | 10/1988 | McConnell et al. | 134/10 |

OTHER PUBLICATIONS

"Cleaning Techniques for Wafer Surfaces," *Semiconductor International*, Aug. 1987, pp. 80–85.

Primary Examiner—Asok Pal
Attorney, Agent, or Firm—Panitch Schwarze Jacobs & Nadel

[57] ABSTRACT

Object surfaces such as semiconductor wafers which are suspended in a rinsing fluid may be dried by replacing the rinsing fluid, such as water, with a drying vapor by directly displacing the water from the surfaces at such a rate that substantially no liquid droplets are left on the surfaces after replacement of the water with drying vapor. Preferably, the drying vapor is miscible with water and forms a minimum-boiling azeotrope with water, such as isopropanol. The drying vapor is then purged with a stream of dry, inert, non-condensable gas such as nitrogen. A vaporizer with automatic refill mechanism produces saturated drying vapor which may then be flashed to a superheated vapor prior to contacting the surfaces, which preferably are at the same temperature as the vapor. Preferably, no liquid is removed by evaporation, and the drying takes place in an enclosed, hydraulically full system which does not require movement or handling of the surfaces between rinsing and drying steps.

27 Claims, 1 Drawing Sheet

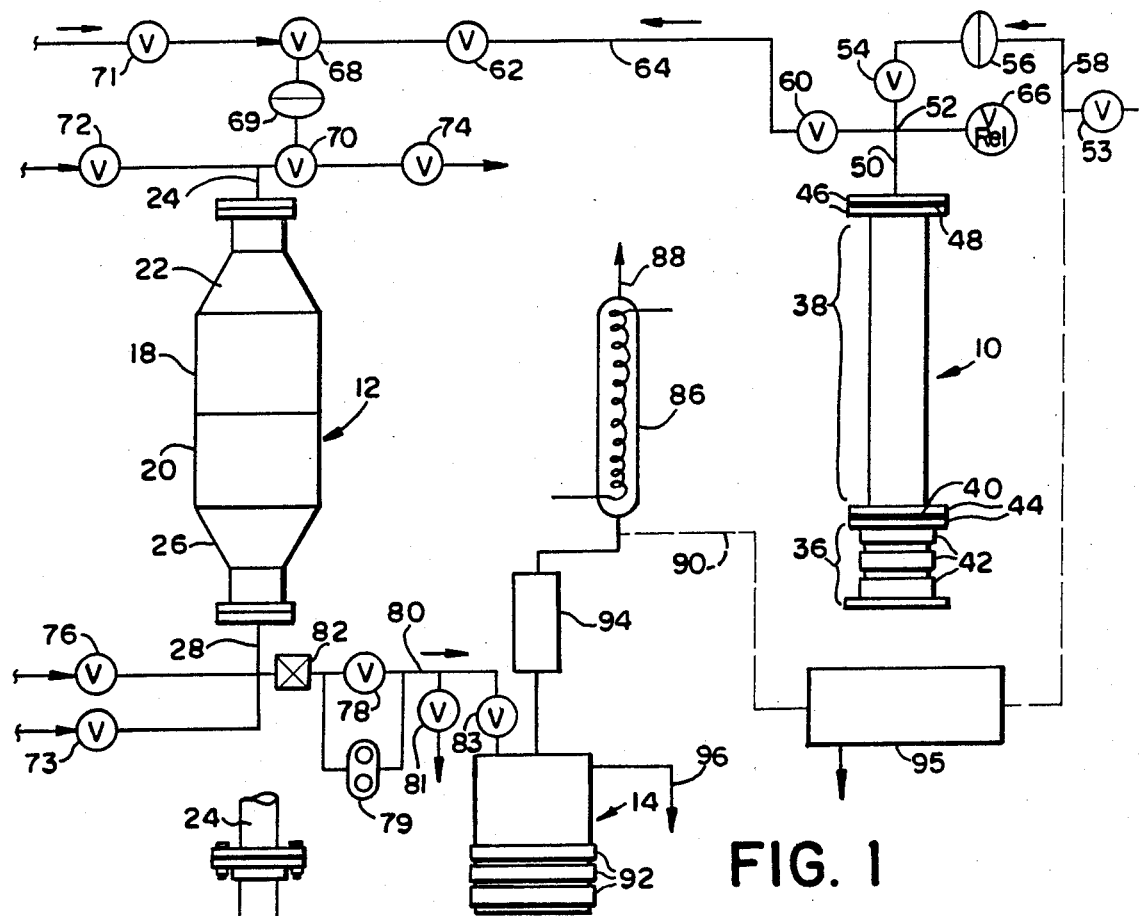
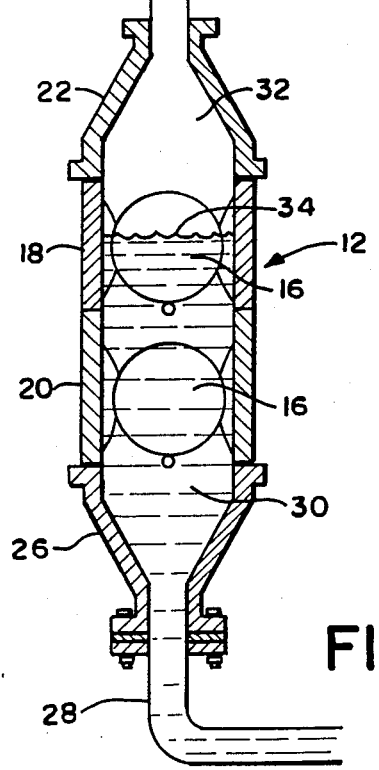
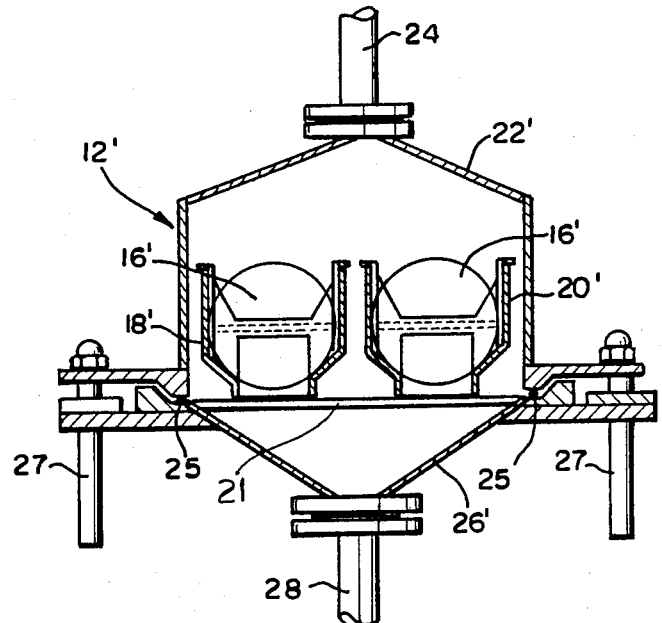
FIG. 1
FIG. 2
FIG. 3

PROCESS AND APPARATUS FOR DRYING SURFACES

CROSS REFERENCE TO RELATED APPLICATIONS

This application is a continuation-in-part of our co-pending application Ser. No. 765,294, filed Aug. 13, 1985 for "Process and Apparatus for Treating Wafers with Process Fluids", now U.S. Pat. No. 4,778,532, which is a continuation-in-part of copending application Ser. No. 747,894, filed June 24, 1985 for "Apparatus for Treating Semiconductor Wafers," now U.S. Pat. No. 4,633,893, which is a continuation-in-part of copending application Ser. No. 612,355, filed May 21, 1984, for "Vessel and System for Treating Wafers with Fluids," now U.S. Pat. No. 4,577,650, and is related to copending application Ser. No. 747,895, filed June 24, 1985 for "Vessel and System for Treating Wafers with Fluids." The disclosure of each of these prior applications is incorporated herein by reference.

BACKGROUND OF THE INVENTION

1. Field of the Invention

The present invention is directed to the drying of surfaces after fluid treatment or wet processing. More particularly, the invention relates to the manufacture of semiconductor components, and in particular to the preparation of semiconductor wafers prior to high temperature processing steps, such as diffusion, ion implantation, epitaxial growth, and chemical vapor deposition steps. Still more particularly, the invention relates to methods and apparatus for the drying of semiconductor wafers after prediffusion cleaning.

2. Prior Art

In the fabrication of semiconductor wafers several process steps require contacting the wafers with fluids. Examples of such process steps include etching, photoresist stripping, and prediffusion cleaning. The equipment conventionally used for contacting semiconductor wafers generally consists of a series of tanks or sinks into which racks of semiconductor wafers are dipped. Wafer carriers are described, for example, in U.S. Pat. Nos. 3,607,478, 3,964,957 and 3,977,926. Such conventional wet processing apparatus poses several difficulties.

Since the tanks are open to the atmosphere, airborne particulates can enter into the process solutions. Through surface tension these particles are easily transferred to the wafer surfaces as the wafers are dipped into and lifted out of the sinks. This particulate contamination is extremely detrimental to the microscopic circuits which the wafer fabrication process creates. It is especially important to minimize particular contamination during prediffusion cleaning.

After fluid processing the wafers normally need to be dried. This can be a particularly challenging process because it is important that no contamination be created during the drying process. Evaporation is undesirable since it often leads to spotting or streaking. Even the evaporation of ultra high purity water can lead to problems because such water is very aggressive to the water surface and will dissolve traces of silicon and silicon dioxide during even short periods of water contact. Subsequent evaporation will leave residues of the solute material on the wafer surface. Contamination and other causes of semiconductor failure are discussed, for example, in J. Schadel, "Device Failure Mechanisms In Integrated Circuits," Solid State Devices 1983 Conf. Ser. No. 69 (Institute of Physics, London 1984) 105-120.

Conventionally, semiconductors are dried through centrifugal force in a spin-rinser-drier. Because these devices rely on centrifugal force to "throw" water off the wafer surfaces, their use results in several problems. First, there are mechanical stresses placed on the wafers which may result in wafer breakage, particularly with larger wafer sizes. Second, because there are many moving parts inside a spin-rinser-drier, contamination control becomes a difficult problem. Third, since the wafers conventionally travel at high velocity through dry nitrogen, static electric charges develop on the wafer surfaces. Since oppositely charged airborne particles are quickly drawn to the wafer surfaces when the spin-rinser-drier is opened, particular contamination results. Fourth, it is difficult to avoid evaporation of water from the surfaces of the wafers during the spin process with the attendant disadvantages discussed above.

More recently, methods and apparatus have been developed for steam or chemical drying of wafers, including the method and apparatus disclosed in our U.S. Pat. No. 4,778,532. Chemical drying generally comprises two steps. First, the rinsing fluid, preferably water is driven off the wafers and replaced by a nonaqueous drying fluid. Second, the nonaqueous drying fluid is evaporated using a predried gas, preferably an inert gas such as nitrogen at a low flow velocity.

Another chemical drying process currently used in Japan consists of sequentially immersing the wafer carrying vessel in tanks of deionized water, followed by suspending the wafers above a tank of boiling isopropanol. The wafer-carrying vessel is then slowly withdrawn from the isopropanol vapor to pull the water droplets off the wafer surfaces.

The most important feature for an effective wafer drying technology is that the wafers produced by ultra-clean, i.e., with minimum particle contamination and minimum chemical residue. Because many drying solvents are flammable, safety is also a very important consideration. Other important design criteria include low chemical consumption, low waste generation, and automated handling with little or no operator exposure.

BRIEF SUMMARY OF THE INVENTION

According to the present invention, a method and apparatus are provided for drying surfaces of objects such as semiconductor wafers after rinsing the surfaces to remove process fluids such as etchants, photoresist strippers or prediffusion cleaners. A drying vapor is supplied to the surfaces in such a manner that the vapor replaces the rinsing fluid by directly displacing the rinsing fluid on the surfaces at such a rate that substantially no liquid droplets are left on the surfaces after replacement of the rinsing fluid with drying vapor. Preferably, the drying vapor is provided from above the objects in a fully enclosed, hydraulically full system, and the drying vapor pushes the rinsing liquid off the surfaces as the liquid level recedes downwardly.

Since the rinsing fluid will usually be water in the liquid phase, it is preferred that the drying vapor be miscible with water and form a minimum boiling azeotrope with water, isopropanol being a particularly preferred drying vapor. Further, the drying vapor should be substantially pure and either saturated or preferably superheated, and the surfaces should be heated to a temperature near to but preferably below that of the drying vapor prior to contact. While this may result in some condensation of vapor on the surfaces, and too much condensation should be avoided, it has been found that preheating to above the temperature of the drying vapor yields poorer results.

The method and apparatus further include a supply of dry, inert, non-condensable gas to purge the drying vapor after replacement of the rinsing fluid, and a boiler and distillation column for concentrating the mixture of rinsing fluid and drying vapor after exit from the processing vessel.

In a preferred embodiment, a vaporizer for producing the saturated drying vapor is provided with a lower boiler section and an upper holding section in which the drying vapor may be rapidly produced in the boiler section and held in the upper section at just the boiling point of the drying fluid. This may be accomplished by an insulating gasket to limit the amount of heat transfer from the boiler section to the holding section. The vaporizer is preferably totally enclosed and may be automatically replenished with fresh drying fluid by lowering the temperature of the fluid in the upper holding section to create a subatmospheric pressure which will draw fresh drying fluid into the vaporizer from a storage source which is preferably maintained below the temperature of the vaporizer. Saturated drying vapor with an appropriate latent heat curve (pressure-enthalpy diagram) is preferably superheated by means of a pressure drop valve and filtered between the vaporizer and the processing vessel.

BRIEF DESCRIPTION OF THE DRAWINGS

The foregoing summary, as well as the following detailed description, will be better understood when read in conjunction with the appended drawings. For the purpose of illustrating the invention, there is shown in the drawings an embodiment which is presently preferred, it being understood, however, that this invention is not limited to the precise arrangement and instrumentality shown in the drawings.

FIG. 1 is a schematic flow diagram illustrating a preferred embodiment of the apparatus of the present invention.

FIG. 2 is a slightly enlarged, more detailed, cross sectional view of the wafer vessel shown in FIG. 1, and illustrating the gas-liquid-solid interface in the wafer vessel.

FIG. 3 is a cross sectional view similar to FIG. 2 but illustrating an alternate wafer vessel and carrier arrangement.

DETAILED DESCRIPTION OF THE PREFERRED EMBODIMENT

While the present invention is directed broadly to the drying of surfaces of solid objects, particularly planar objects, after various wet processing or fluid treatments, the invention will be described with particular reference to the drying of semiconductor wafers after prediffusion cleaning and rinsing, it being understood that the same general principles apply to the drying of other wet surfaces.

Further, while the drying system of the present invention may be used with a variety of cleaning, etching or other wafer processing methods and apparatus, the present system is specifically adapted for use in the process and apparatus for treating wafers with process fluids, as described and claimed in our U.S. Pat. No. 4,778,532. Thus, the present invention is an improvement which may be substituted for the steam or chemical drying systems described in that application.

Similarly, while various wafer carrying vessels may be used to suspend the semiconductor wafers in the rinsing and drying fluids as described herein, the wafer carrier described in our U.S. Pat. No. 4,577,650 has been found to be particularly suitable for use in the method and apparatus of the present invention. Such carriers are shown in simplified form in FIG. 2 of the present application for purposes of illustrating the present invention.

The apparatus for carrying out the present invention includes three primary pieces of equipment, namely a vaporizer 10 for producing drying vapor, a vessel 12 for holding the wafers for treatment with rinsing fluid and drying vapor, and a boiler 14 for concentrating used rinsing fluid and drying vapor for disposal and/or reuse. These three units with their associated piping, valves and other elements are shown schematically in FIG. 1.

Referring first to FIG. 2, a preferred vessel 12 for use in the present invention is illustrated. A plurality of semiconductor wafers 16 is shown (from a side view) suspended in two rows of parallel, vertically oriented wafers in upper and lower wafer carriers 18, 20, of the type described more fully in our U.S. Pat. No. 4,577,650. While two such wafer carriers 18, 20 are illustrated in FIG. 2 stacked one on top of the other, it will be understood that vessel 12 could include only one such wafer carrier or more than two such carriers. In some instances vertical stacking may cause undesirable dripping onto lower carriers.

Wafer carriers 18, 20 are held in place by upper vessel clamp 22 connected to the fluid inlet 24 and lower vessel clamp 26 connected to fluid outlet 28. In FIG. 2 vessel 12 is shown partially full of rinsing liquid 30 as drying vapor 32 fills the upper portion of vessel 12 and pushes the gas-liquid-solid interface 34 downwardly across wafers 16 in upper wafer carrier 18.

In FIG. 3 a vessel 12' is shown which allows for a plurality of SEMI (Semiconductor Equipment and Materials Institute, Inc.) approved wafer carriers to be arranged side by side. In this embodiment upper vessel clamp 22' is in the form of a bell jar lid which is sealed over lower vessel clamp 26' by means of a gasket 25 and clamp fittings 27. Wafer vessels 18', 20', holding wafers 16', are supported on rods 21 in lower vessel clamp 26'. The vessel 12' is shown empty of rinsing fluid.

It will be understood that other vessel arrangements (not shown) can be used in carrying out the present invention. For example, another embodiment would allow for one or more wafer carriers to be placed in an overflow-type sink situated in a lower vessel clamp with an appropriate cover, such as a bell jar lid similar to upper vessel clamp 22' in FIG. 3, to seal the system and provide for overflow and waste removal. Sealing the system is important to allow blanketing the vapor space around the wafers with drying vapor to prevent the introduction of foreign gases, e.g., nitrogen gas, during the direct displacement of the rinsing fluid with the drying fluid.

Referring to FIG. 1, vaporizer 10 includes a lower boiler section 36 and an upper holding section 38, with the metal casings of the boiler and holding sections being separated by an insulating gasket 40 which limits the amount of heat transfer from the lower metal casing to the upper metal casing.

Boiler 36 is provided with heating bands 42 or other suitable heat transfer device to quickly heat the drying fluid above its boiling point. The boiler 36 should always be maintained full of liquid drying fluid so that the heat transfer surfaces are continually immersed. For this purpose a liquid level detector and switch (not shown) may be provided, as well as resistance temperature detectors (not shown) for measuring the heat of the drying liquid and monitoring the temperature of the heating bands.

The insulating gasket 40 may be of any suitable material which will withstand the heat of boiler section 36 and will resist corrosion by the drying fluid. For example, an envelope gasket which will fit between two ANSI flanges 44 of the boiler section 36 and holding section 38 will be suitable. The insulating gasket prevents troublesome temperature/pressure overshoot from rapid heatup of the metal casing without simultaneous heatup of the contained drying fluid. Thus, while the boiler may be very hot to quickly produce drying vapor, the holding section 38 should remain at just the temperature of the boiling drying fluid, which may be an elevated pressure boiling point.

The holding section 38 essentially holds the liquid capacity of the vaporizer, with the disengagement between liquid and vapor occurring at the very top, near flanges 46. A similar insulating gasket 48 may be placed between the flanges 46 to avoid unnecessary heat transfer from the top of holding section 38 near the liquid vapor interface. Holding section 38 may be provided with other associated devices (not shown), including a level detector and switch, heat tracing, and water cooldown jacket.

Drying liquid and vapor enter and leave holding section 38 through tubing 50 and cross connection 52. Fresh and/or recirculated liquid drying fluid enters vaporizer 10 through valve 54, preferably a bellows valve, and filter 56, preferably a submicron filter such as available under the trademark Millipore, in inlet line 58 which is connected to a source of fresh drying fluid (not shown) through 53 and/or to distillation column 94 and waste liquid receiver 95 which provide recirculated drying fluid as discussed below.

Saturated drying vapor flows to vessel 12 through valve 60, preferably also a bellows valve, and flash valve 62 in line 64. As will be described more fully below, the flash valve may be use to lower the pressure and thereby superheat the saturated drying vapor. After passing through flash valve 62 and 3-way selector valve 68, the drying vapor preferably also goes through a final 0.01 micron ceramic filter 69, such as a Model PGF-2 filter manufactured by Fastek division of Eastman Technology, Inc., because gases can be filtered to a higher degree than liquids.

Cross connection 52 is also provided with a pressure release valve 66 for emergency over pressurization of the vaporizer. The vaporizer may also be provided with a maintenance drain (not shown) at the bottom of the boiler 36.

Vessel 12 may be provided with other valves 70, 72, 74 and 76 for the control of various process fluids, such as etching, stripping, cleaning and/or rinsing fluids which may enter and exit the vessel 12 for treatment of wafers 16. The manner in which these fluids may be controlled for entry into and exit from vessel 12 is described in more detail, for example, in our U.S. Pat. No. 4,778,532, but does not form a part of the present invention.

As drying fluid displaces rinsing fluid from wafers 16 at interface 34, the drying fluid mixes with the rinsing fluid and also forms a distinctive drying fluid layer on top of the rinsing fluid, reaching more than one half inch in thickness in some cases.

This final rinsing fluid and drying fluid layer exit vessel 12 through valve 78 or metering pump 79 in line 80 which leads to boiler 14 for concentration and/or disposal of the used fluids. Preferably metering pump 79 is a variable rate pump to allow better control of the interface descent rate and to optimize drying time. Just preceding valve 78 and metering pump 79 in line 80 is a capacitance switch (limit switch) 82 which senses when vessel 12 has drained completely. At that point vapor line 64 is closed and a purging gas may be passed into vessel 12 through valves 71, 68 and 70 and filter 69.

Drying vapor and purging gas may also exit vessel 12 through valve 78 and pass into boiler 14. To achieve even better control of the descent rate of interface 34 and to optimize drying time, the rinsing liquid may be removed during at least part of the descent by a variable rate metering pump 79. The rinsing fluid is discarded to drain through valve 81. At the appropriate time, the layer of drying fluid and a layer of rinsing fluid immediately below it are diverted to boiler 14 through valve 83.

Boiler 14 is provided with band heaters 92 or immersion heaters to strip the drying fluid or an azeotrope of the drying fluid and rinsing fluid from the waste water. The vapor goes through distillation column 94 for further concentration. A water-cooled condenser 86 condenses the drying vapor. Cool, non-condensable gas (e.g., purge gas) exits the condenser through vent 88, while a portion of the condensate exits through drain 90 into a waste liquid receiver 95 for recirculation to the feed line 58 for vaporizer 10.

Distillation column 94 may be a single column or a series of columns of generally conventional design, depending upon the degree of concentration of the drying fluid desired for recirculation or disposal of used fluid. The waste water from which the vapor has been stripped exits boiler 14 through overflow valve 96 as a new batch of used fluid enters boiler 14 from the next run. Fresh drying fluid may be added to the recycled fluid through valve 83.

In carrying out the method of the present invention, a drying fluid is selected which is miscible with the rinsing fluid and preferably forms a minimum-boiling azeotrope with the rinsing fluid. Since water is the most convenient and commonly used rinsing fluid, a drying fluid which forms a minimum-boiling azeotrope with water is especially preferred. Generally, the drying fluid should be an organic compound which is non-reactive with the surface to be dried and has a boiling point less than 140 degrees Centigrade at atmospheric pressure.

The chemical found most effective for drying is isopropyl alcohol (isopropanol). Isopropanol is economical, relatively safe (nontoxic) and forms a minimum-boiling azeotrope with water. Also of importance, isopropanol has a low surface tension and has both hydrophobic and hydrophilic characteristics (i.e., it is miscible in both oil and water). Without wishing to be bound by any particular theory, it is believed that isopropanol has a tendency to break the harsh surface tension between the hydrophilic water and the relatively hydrophobic wafer surface. Since the solid phase at interface 34 is the wafer surface and the liquid phase is ultra pure water, the choice of gas phase properties can have a tremendous impact which isopropanol appears to satisfy best.

The method of the present invention will now be described in more detail with reference to the above described apparatus and the preferred rinsing fluid (water) and drying vapor (isopropanol), although it will be understood that the method can be carried out with other suitable apparatus, and the method will be similar for other rinsing and drying fluids.

In the wet processing of semiconductor wafers according to the method of our U.S. Pat. No. 4,778,532, it is advantageous with some process fluids to have the fluid flow upwardly through the vessel 12 so that the fluid inlet 24 becomes an outlet and the fluid outlet 28 is the inlet. This is true of the rinsing fluid which normally circulates upwardly through vessel 12. However, according to the present invention, it has been found that the optimal configuration for wafer drying is downflow.

Preferably, the last cycle of rinsing with ultra pure water is with hot water (e.g., 65-85 degrees Centigrade) in order to heat the wafers to approximately the boiling point of the isopropanol (82 degrees Centigrade). Alternatively, the wafers 16 may be heated by direct solid solid heat transfer through wafer carriers 18, 20 by means of heating bands or other heating devices applied to the carriers.

After the final rinsing cycle, vessel 12 is left hydraulically full with ultra pure hot water. Valve 78 may then be opened. However, the water will not leave vessel 12 because nothing has been allowed to enter at the top to replace it. Flash valve 62 and valve 70 are then opened to introduced a stream of pure, saturated isopropanol vapor to vessel 12 through inlet 24. As vapor enters the upper vessel 22, water flows out the bottom 26 through fluid outlet 28 and valve 78.

Alternatively, the rinsing water may be removed from vessel 12 by metering pump 79, with the flow rate being changed depending upon the phase of the removal cycle. For example, the metering pump 79 can be run at a very high rate until the interface 34 is just above the wafers, then slowed down as the interface descends past the wafers. Finally, after the interface has passed the last wafer surface 16, the bypass valve 78 around pump 79 may simply be opened and the remaining water and drying fluid may be blown from the vessel by purging gas.

It is believed to be important that the downward velocity of the gas-liquid-solid interface 34 be controlled at a relatively slow rate, although there is a compromise which must be taken into consideration. Thus, if the rinsing water exits vessel 12 too fast, liquid droplets will remain on the wafers and contamination will occur when these droplets are evaporated. Hence, it is preferred that the drying vapor displace the rinsing fluid from the wafers at such a rate that substantially no liquid droplets are left on the wafer surfaces after replacement of the water with isopropanol. On the other hand, a faster descent of interface 34 increases dryer productivity and minimizes chemical consumption.

Generally, interface descent rates (velocities) in the range of about one to four inches per minute have been found satisfactory. Descent rates much beyond five inches per minute yield poor results, whereas descent rates below about one inch per minute are inefficient. It has also been found that warmer vessel temperatures of about 75 degrees Centigrade result in better drying performance by allowing a faster interface descent than a cooler vessel at about 60 degrees Centigrade.

Similarly, consistent with the desire that liquids not be removed from the wafer surfaces by evaporation, it is preferred that the isopropanol be superheated in order to provide a drier vapor and avoid the risk of condensation of a vapor on the wafer surfaces. An advantage of an organic liquid such as isopropanol is that its latent heat curve in its pressure-enthalpy diagram slopes backwardly so that a pressure drop pushes the saturated vapor into the superheated region of the phase diagram. As a result, passing the saturated vapor produced by vaporizer 10 through a flash valve 62 results in a drier, superheated vapor being supplied to wafers 16 in vessel 12.

Holding section 38 of vaporizer 10 preferably holds enough liquid IPA so that vaporizer 10 may supply several loads of wavers without being replenished. When it is necessary to add fresh isopropanol to vaporizer 10, this may be done automatically by allowing the temperature of the boiling isopropanol in holding section 38 to drop below its boiling point (82 degrees Centrigrade at atmospheric pressure). The temperature lowering may be assisted by use of a cooling jacket (not shown) on holding section 38. When the temperature drops below the boiling point, the vapor pressure in the vaporizer 10 becomes subatmospheric. When valve 54 is then opened, liquid isopropanol is drawn from storage by suction to the vaporizer. Because this liquid isopropanol is generally cooler than the vaporizer itself, the pressure in the vaporizer reduces further, enhancing the refill operation.

As rinsing water leaves vessel 12 through valve 78 or metering pump 79 to drain 81 or valve 83, limit switch 82 senses when vessel 12 has drained completely of liquid. As soon as the vessel is completely empty, line 64 is closed and a stream of dry, inert, non-condensable gas, such as nitrogen, is admitted through valves 71, 68 and 70 to purge vessel 12 of isopropanol vapor. Since the nitrogen purge gas also goes through ceramic filter 69 between valves 68 and 70, the filter is inherently purged with nitrogen after the isopropanol. It is believed that this purge prevents isopropanol condensation and resultant blinding problems inside the filter.

This purge quickly flushes all of the remaining vapor out of vessel 12 through drain valve 78. The nitrogen purge displaces isopropanol vapor out of the vessel and removes what appears to be a monolayer of isopropanol on the wafer surfaces. The monolayer is very volatile but the mechanism of removal appears different from evaporation.

Finally, the last of the used water and the isopropanol from vessel 12 enter boiler 14. The purpose of boiler 14 and distribution column 94 is to hold the isopropanol contaminated water mixture and reconcentrate the isopropanol into a smaller volume for recirculation or disposal. Once vessel 12 is emptied of liquid, the nitrogen purge begins. This nitrogen gas flows through and out of vessel 12 into boiler 14, exiting through condenser 86 and vent 88.

Since the isopropanol appears to be concentrated in a layer on top of the water as interface 34 descends in vessel 12, it is not necessary to strip all of the water which first exits vessel 12. Therefore, most of the water is allowed to flow through valve 81, and the last pint or so of liquid (i.e., the isopropanol layer and water immediately below it) is trapped in boiler 14 for processing.

Since such a small amount of liquid is involved, and the isopropanol/water 1mixture may be boiled readily.

As band heaters 92 are energized, the water/isopropanol mixture is heated, and the azeotrope isopropanol water mixture (boiling point 79 degrees Centrigrade) vaporizes out of the waste water. This gaseous blend goes through distillation column 94 to condenser 86 where it is condensed and is either collected in a waste-liquid receiver 95 from drain 90 or is refluxed to distillation column 94. Waste water from which the azeotrope and vapor have been removed overflows through valve 96 before used water from the next run enters boiler 14 from vessel 12.

Essentially, boiler 14 performs a crude separation, so that liquid sent to distillation column 94 from condenser 86 might be 50 weight percent wafer and 50 weight percent isopropanol. The distillation column will then separate the azeotrope from the water to a 90 weight percent isopropanol/10 percent water azeotrope. This azeotrope may be reintroduced to vaporizer 10 on a batch basis, or continuously, as desired, through waste receiver 95 and appropriate mixing tanks and/or filters.

As indicated previously, if any water is left on the water surface after rinsing, streaking, spotting and particulate contamination will almost invariably occur. An advantage of using a minimum-boiling azeotrope, such as isopropanol with water, is that any residual water film on the wafer surface, when combined with the isopropanol vapor will immediately flash into the gas phase as the azeotrope.

While one theory holds that the efficiency of drying depends upon the thickness of the liquid isopropanol layer on the top of the receding rinsing water at interface 34, a thin isopropanol liquid layer or no layer at all is preferred due to fewer disposal problems, lower drying fluid cost, and fewer flammability problems. Regardless of the validity of this theory, it appears to be clear that streaking and spotting are minimized by decreasing the velocity of the receding water level (interface 34) and increasing the dryness of the vapor (superheat).

While the above description contemplates either recycling of isopropanol (closed loop system) or merely the stripping of the mixture to concentrate the organic liquid for disposal, purifying the isopropanol or other drying vapor for recovery and recycling is preferred because of environmental and economic considerations. The azeotrope mixture has a lower flash point and better heat transfer characteristics including heat capacity and heat transfer coefficient, apparently without sacrifice of particle performance (cleanness) of the wafers compared to the use of fresh, pure isopropanol alone.

Without wishing to be bound by any particular theory, it is believed that if interface 34 recedes at a sufficiently slow rate, the water/isopropanol interface will pull all of the water and azeotrope droplets off the wafers as the liquid level recedes. However, if the interface 34 recedes too quickly, the surface tension or affinity of water or other droplets for the wafer surface will exceed the surface tension of the receding liquid. Drops will then be left on the wafer which will have to be evaporated, leaving streaks and contamination. Thus, it is believed that the method of the invention involves a physical pushing by the vapor or pulling by the liquid surface, resulting in direct displacement by vapor for liquid rather than an evaporation of liquid droplets.

It will be appreciated from the above description that the method and apparatus of the invention may be an enclosed, full flow system which is preferably hydraulically full (i.e. sealed) during both rinsing and drying steps, and requires no movement or handling of the wafers between rinsing and drying. The advantages of such systems are disclosed in our U.S. Pat. No. 4,778,532.

The present invention results in improved drying efficiency of semiconductor wafers with less contamination of the wafer surfaces by dissolved particles and other contaminants which may be present in prior systems.

The present invention may be embodied in other specific forms without departing from the spirit or essential attributes thereof, and, accordingly reference should be made to the appended claims, rather than the specification, as indicating the scope of the invention.

We claim:

1. A method for drying surfaces of objects which are suspended in a rinsing fluid comprising providing a drying vapor, replacing said rinsing fluid with said drying vapor by directly displacing said rinsing fluid from said surfaces with said vapor at such a rate that substantially no liquid droplets are left on the surfaces after replacement of the rinsing fluid with drying vapor.

2. A method according to claim 1 wherein said rinsing fluid is water in the liquid phase.

3. A method according to claim 2 wherein said surfaces are heated to approximately the temperature of said drying vapor prior to being contacted by said vapor.

4. A method according to claim 3 wherein said heating is effected by said rinsing fluid as the heat transfer means.

5. A method according to claim 3 wherein said heating is effected by solid/solid heat transfer from a carrier which suspends said objects.

6. A method according to claim 1 wherein said rinsing fluid is pushed downwardly by said drying vapor.

7. A method according to claim 1 wherein said rinsing fluid is drawn away from said objects by external pumping means.

8. A method according to claim 1 wherein said drying vapor is purged from said surfaces by introducing a dry, inert, non-condensable gas after replacement of said rinsing fluid.

9. A method according to claim 8 wherein said gas is nitrogen.

10. A method according to claim 1 wherein said drying vapor is saturated.

11. A method according to claim 1 wherein said drying vapor is superheated.

12. A method according to claim 2 wherein said vapor is miscible with water.

13. A method according to claim 2 wherein said vapor forms a minimum-boiling azeotrope with water.

14. A method according to claim 13 wherein said vapor is isopropanol.

15. A method according to claim 1 wherein said vapor is an azeotrope.

16. A method according to claim 2 wherein said drying vapor is an isopropanol/water azeotrope.

17. A method according to claim 1 wherein substantially no rinsing fluid or drying vapor is removed by evaporation of liquid droplets.

18. A method according to claim 1 wherein said drying vapor is an organic compound non-reactive with said surfaces and having a boiling point less than 140 degrees Centigrade at atmospheric pressure.

19. A method according to claim 1 which does not require movement or handling of said surfaces between rinsing and drying steps.

20. A method according to claim 19 wherein the vessel in which said objects are suspended is hydraulically full during said rinsing and drying steps.

21. A method according to claim 20 wherein said objects are blanketed with drying vapor immediately after removal of the rinsing fluid.

22. A method according to claim 1 wherein said objects are semiconductor wafers.

23. A method according to claim 1 wherein said vapor is filtered in the vapor phase prior to contacting said surfaces.

24. A method according to claim 1 wherein said drying vapor is collected and recycled after drying said surfaces.

25. A method according to claim 24 wherein said vapor is recycled in the form of an azeotrope with said rinsing fluid.

26. An enclosed, full flow method for drying semiconductor wafers which are immersed in a vessel containing a hot water rinsing liquid comprising introducing isopropanol vapor from above the wafers to remove and replace said water as the water level recedes downwardly from the wafers at such a rate that substantially no liquid droplets are left on the wafer surfaces, said wafers being at substantially the same temperature as said vapor when contacted by the vapor.

27. An enclosed, full flow method for drying surfaces of objects which are immersed in a vessel containing a rinsing fluid comprising introducing a drying vapor from above the objects to remove and replace the fluid, such that the fluid level recedes downwardly from the objects at such a rate that substantially no liquid droplets are left on the object surfaces after replacement of the rinsing fluid with the drying vapor.

* * * * *